United States Patent [19]
Peterzell et al.

[11] Patent Number: 5,469,115
[45] Date of Patent: Nov. 21, 1995

[54] METHOD AND APPARATUS FOR AUTOMATIC GAIN CONTROL IN A DIGITAL RECEIVER

[75] Inventors: Paul E. Peterzell; Nathaniel B. Wilson, both of San Diego, Calif.; Peter J. Black, St. Lucia, Australia

[73] Assignee: QUALCOMM Incorporated, San Diego, Calif.

[21] Appl. No.: 235,811

[22] Filed: Apr. 28, 1994

[51] Int. Cl.[6] .................................................. H03G 3/30
[52] U.S. Cl. ........................ 330/129; 330/141; 455/240.1
[58] Field of Search ..................... 330/129, 141, 330/279, 281; 332/123, 124, 125; 455/234.1, 240.1, 245.1, 250.1

[56] References Cited

U.S. PATENT DOCUMENTS 4,301,445  11/1981  Robinson ........................... 330/284 X
5,107,225   4/1992  Wheatley et al. ...................... 330/279

*Primary Examiner*—Steven Mottola
*Attorney, Agent, or Firm*—Russell B. Miller; Gregory D. Ogrod

[57] ABSTRACT

An automatic gain control (AGC) apparatus for a digital receiver is disclosed herein. The AGC apparatus includes an adjustable gain amplifier having an input port for receiving an input signal, a control port for receiving a gain control signal, and an output port for providing an output signal. The AGC apparatus further includes a measurement circuit for generating a received power signal based on the power of the output signal. A saturating integrator compares the received power signal to a reference signal and generates an gain control signal in response to a result of the comparison. The saturating integrator includes a decision circuit for enabling integration based on values of the received power signal, the reference signal, and the gain control signal. In a preferred implementation the utilization of an input limiter in conjunction with an analog to digital converter enables accommodation of an increased input signal dynamic range. Accordingly, the AGC apparatus is capable of being used in digital demodulation of FM signals. The AGC apparatus may also be employed within a dual mode receiver designed to process both FM and code division multiple access (CDMA) input signals.

39 Claims, 8 Drawing Sheets

METHOD AND APPARATUS FOR AUTOMATIC GAIN CONTROL IN A DIGITAL RECEIVER

BACKGROUND OF THE INVENTION

I. Field of the Invention

The present invention relates generally to automatic gain control circuits. More particularly, the present invention relates to a novel method and apparatus for providing automatic gain control within a digital receiver.

II. Description of the Related Art

In analog receivers, such as are used in narrowband FM cellular communication systems, FM demodulators are employed to extract information encoded in the phase of an incident waveform. Existing FM demodulators often include an analog frequency discriminator preceded by an analog limiter, with the limiter serving to constrain the input signal power to a constant level. In this way maximum signal to noise ratio is maintained at the input to the frequency discriminator over the full dynamic range of the FM input signal. However, such an analog signal processing technique generally involves extensive signal filtering, and frequently is implemented using a large number of discrete components. Moreover, it has been demonstrated that improved performance may be achieved using linear digital waveform demodulation rather than analog demodulation. Unfortunately, conventional demodulation techniques are often not applicable to digital receivers, since clipping of the received signal would result in corruption of the data derived therefrom.

A digital receiver for receiving a digitally modulated information signal will generally include a variable gain amplifier with a gain adjusted by a control signal. The process of adjusting the gain of a received signal using a control signal is called Automatic Gain Control (AGC). Typically in digital receivers, the AGC process involves measurement of an output signal power of the variable gain amplifier. The measured value is compared with a value representing the desired signal power and an control signal for the variable gain amplifier is generated. The error value is then used to control amplifier gain so as to adjust the signal strength to coincide with the desired signal power. To effect digital demodulation with an optimal signal to noise ratio, automatic gain control is used to hold the magnitude of the baseband waveforms close to the full dynamic range of the baseband analog to digital converters. This generally requires, however, that automatic gain control be provided over the full dynamic range of the received signal power.

In the cellular environment, a digital receiver may receive a signal which experiences rapid and wide variations in signal power. In digital receivers such as are used in a code division multiple access (CDMA) mobile cellular telephone, it is necessary to control the power of the demodulated signal for proper signal processing. However, in digital receivers to be both CDMA compatible and conventional FM compatible, i.e., dual-mode CDMA/FM receivers, it is necessary to provide power control of both wideband CDMA signals and narrowband FM signals. The control process is complicated by the differing dynamic ranges associated with the received FM and CDMA signal power. That is, the magnitude of received FM signals may vary over a dynamic range greater than 100 dB, whereas CDMA systems typically result in a more limited dynamic range, i.e., approximately 80 dB.

The provision of separate AGC circuitry for each mode increases the hardware complexity and expense of such receivers. Accordingly, it would be desirable to provide AGC circuitry capable of operating both upon narrowband, wide-dynamic range FM signals, as well as upon wideband CDMA signals of more limited dynamic range.

It would also be desirable to provide digital AGC in inexpensive receivers utilizing analog to digital (A/D) converters with limited dynamic range. Again, because FM signals within cellular systems may vary more than 100 dB and relatively inexpensive 8-bit A/D's are limited to a dynamic range of approximately 48 dB, a cost effective AGC implementation should be capable of controlling the gain of the portion of the receiver preceding the A/D converters so as not to exceed the dynamic range of the A/D converter. The alternative is to employ expensive A/D converters having greater dynamic range, thereby increasing the cost of the receiver or to increase the AGC range of the analog portion of the radio which is very difficult and costly.

It is therefore an object of the present invention to provide a novel and improved AGC circuit which incorporates the desirable features mentioned above, and which, as is described hereinafter, also realizes certain other advantages relative to conventional AGC techniques.

SUMMARY OF THE INVENTION

The present invention is a novel automatic gain control method and apparatus for controlling signal power of a received RF signal over a wide dynamic range. In a preferred implementation the automatic gain control apparatus may be adjusted to provide a desired control response to various fading characteristics of the received RF signal. In applications where the signal of interest is either a wideband signal, such as a CDMA signal containing digital information, or a narrowband signal, such as an FM signal containing analog information, the apparatus of the present invention is capable of providing the necessary gain control.

In accordance with the present invention an automatic gain control (AGC) apparatus for a dual mode receiver is disclosed. The AGC apparatus includes an adjustable gain amplifier having an input port for receiving an input signal, a control port for receiving a gain control signal, and an output port for providing an output signal. The AGC apparatus further comprises means for generating a received power signal based on the power of the output signal. A saturating integrator compares the received power signal to a reference signal and produces the gain control signal by integrating or by refraining from integration based on values of the reference, received power signal, and gain control signals.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

In a digital receiver, such as used in a code division multiple access (CDMA) portable cellular communications device, it is necessary to set the power of the processed signal to a constant level. In the cellular environment, a receiver may receive a signal which experiences rapid and wide variations in signal power. In order to properly process the digital data contained within the received signal the signal power must be controlled within the receiver. In a dual-mode digital receiver, e.g., a digital receiver capable of processing both CDMA and standard FM signals, the received signal dynamic range will vary as a function of the selected operative mode. Accordingly, an automatic gain control apparatus for a digital receiver is disclosed which is capable, in each of its operative modes, of compensating for variation in received signal power in either environment.

Figure 1:
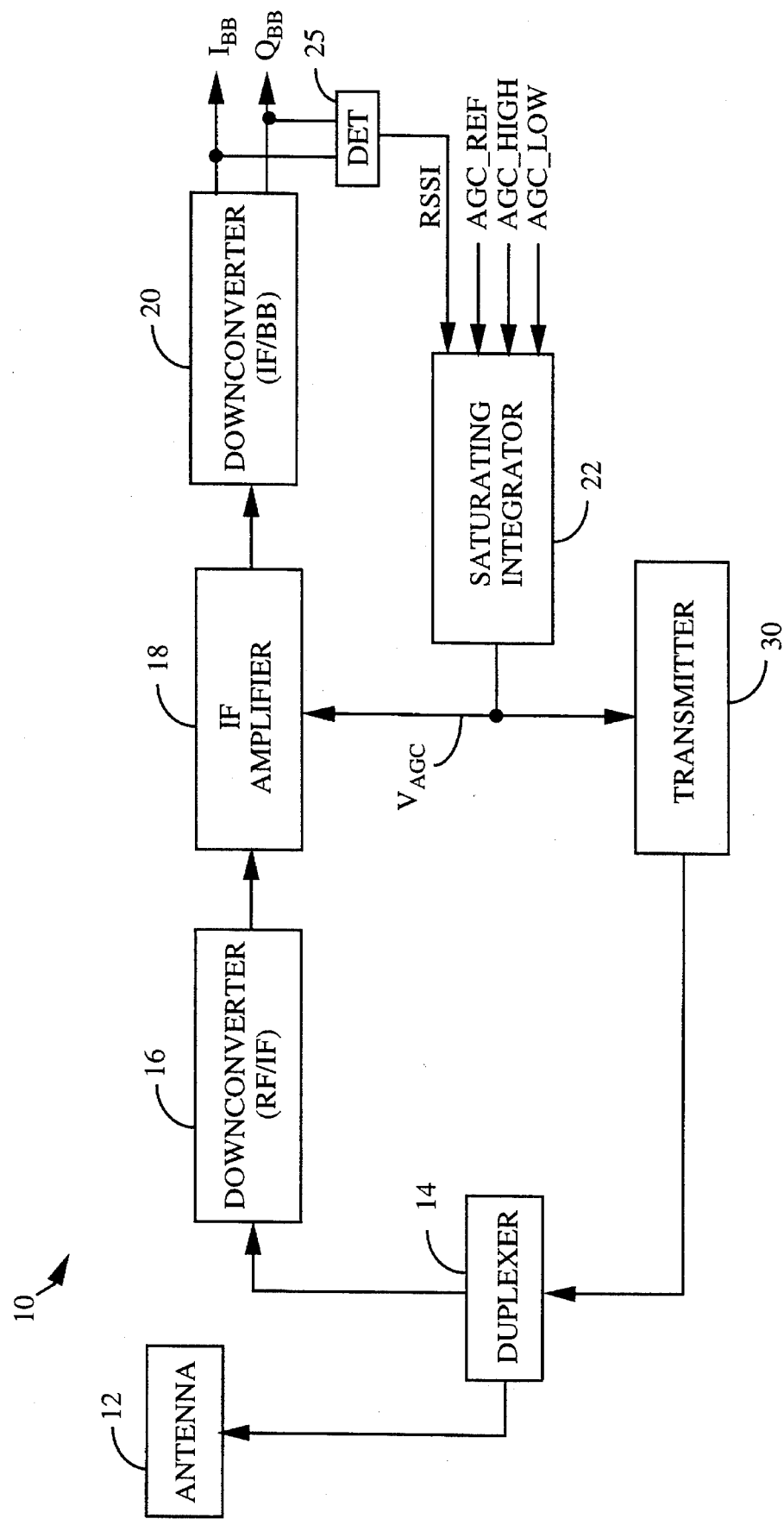
FIG. 1 illustrates in block diagram form an exemplary application of the automatic gain control apparatus (AGC) of the present invention.

FIG. 1 illustrates in block diagram form an exemplary application of the automatic gain control apparatus of the present invention. In FIG. 1, the automatic gain control apparatus is implemented in the transceiver of a CDMA portable cellular telephone 10. Telephone 10 may be a dual mode, i.e. CDMA and conventional FM compatible. The automatic gain control apparatus of the present invention is capable of providing power control of both wideband CDMA signals and narrowband FM signals. The compatibility of such circuitry to operate on both wideband and narrowband signals provides cost, component and power savings for the receiver.

Telephone 10 includes antenna 12 for receiving RF signals, including CDMA or FM communication signals, transmitted from a base station. Antenna 12 couples the received signals to duplexer 14 which provides the received signals to the receiver portion of telephone 10. Duplexer 14 also receives CDMA or FM communication signals from a transmitter portion of telephone 10 for coupling to antenna 12 and transmission to a base station.

The received signals are output from duplexer 14 to downconverter 16 where the RF signals are converted to a lower frequency range and are provided as corresponding intermediate frequency (IF) signals. The IF signals from downconverter 16 are provided to automatic gain controlled IF amplifier 18. The IF signals are amplified at a gain level determined by an AGC signal ($V_{AGC}$) which is also provided to amplifier 18. Amplifier 18 is capable of providing linear control of gain over a high dynamic range, such as in excess of 80 dB, on the basis of a $V_{AGC}$. Amplifier 18 may be of a design described in, for example, U.S. Pat. No. 5,099,204, entitled "LINEAR GAIN CONTROL AMPLIFIER", and assigned to the Assignee of the present invention.

In the above-referenced U.S. Pat. No. 5,099,204, a compensation circuit is employed to achieve a desired dynamic range of linear control. In particular implementations such control may be provided by the amplification circuit in the absence of assistance from a compensation circuit. Included among such implementations are those, for example, in which several amplification stages are arranged in cascade. Similarly, the availability of a high-voltage power supply may eliminate the need for a compensation circuit.

The gain controlled IF signals are output from amplifier 18 to a second frequency downconverter, downconverter 20, where the IF signals are converted to a lower frequency range and are provided as corresponding quadrature phase baseband signals $I_{BB}$ and $Q_{BB}$. In the embodiment shown in FIG. 1, the baseband signals in the CDMA mode of operation are I and Q samples of encoded digital data which are output for further phase demodulation and correlation. In a dual mode receiver, downconverter 20 also frequency downconverts FM signals so as to provide baseband FM in-phase and quadrature-phase signals, which are further phase/frequency demodulated into an audio output signal.

Detector 25 measures the strength of the signals output by downconverter 20 and generates a corresponding received signal strength indication (RSSI) signal. The RSSI signal, along with an AGC reference signal (AGC_REF) supplied by a controller (not shown), are provided to a saturating integrator network 22. The AGC_REF signal corresponds to a desired signal strength level for the baseband signals. The controller also provides AGC limit low (AGC_LOW) and AGC limit high (AGC_HIGH) reference signals to saturating integrator 22. The AGC_HIGH and AGC_LOW signals correspond to limits on the magnitude of a gain control signal ($V_{AGC}$) provided to a control port of amplifier 18 by saturating integrator 22.

Figure 2:
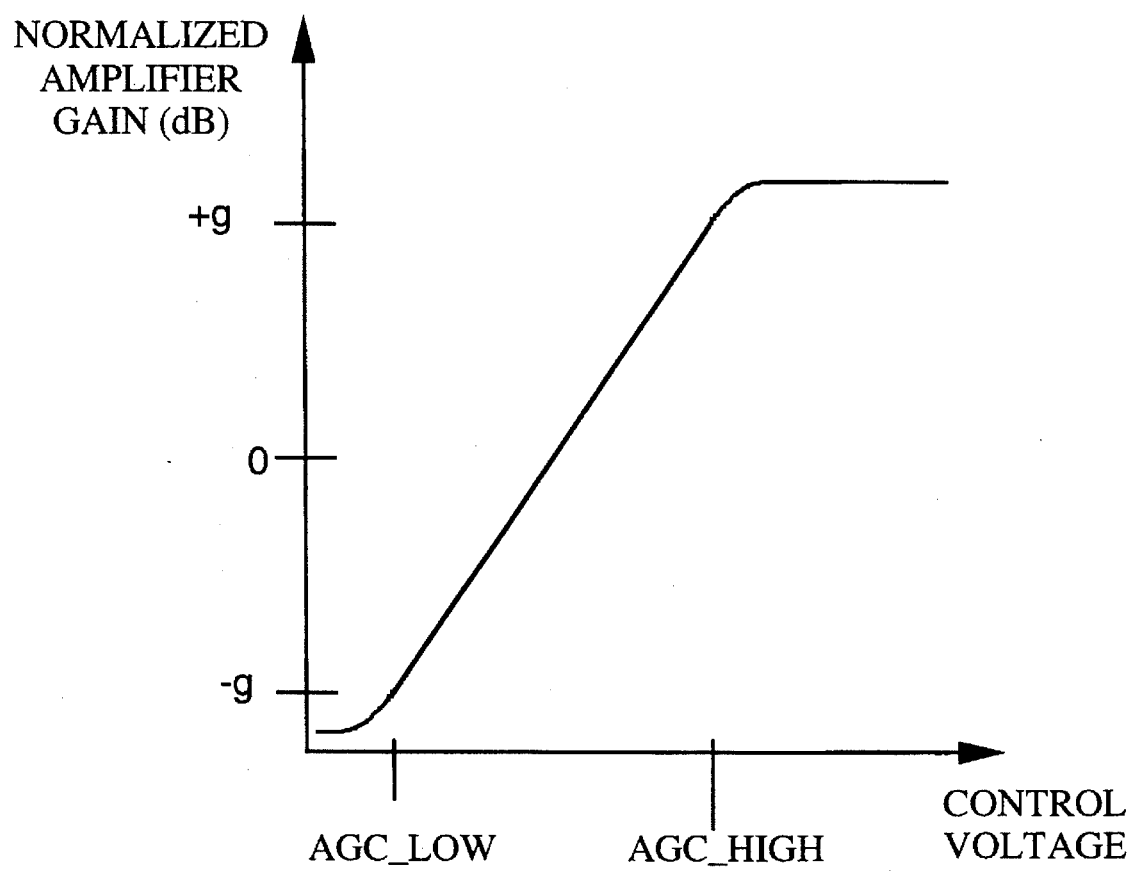
FIG. 2 illustratively represents the gain of an AGC amplifier as a function of the gain control voltage.

FIG. 2 illustratively represents the gain of amplifier 18 as a function of the gain control voltage. Referring to FIG. 2, the gain of amplifier 18 is seen to nonlinearly taper to relatively constant values for control voltages exceeding AGC_HIGH and less than AGC_LOW. In general, it will be desired to constrain the value of $V_{AGC}$ to within the linear range between AGC_HIGH and AGC_LOW in order that the corresponding time constant of the control loop remain within an acceptable range. Deviation of the loop time constant from the acceptable range could result in significant loop control errors. In accordance with the invention, amplifier 18 is constrained to operate within a region of linear gain by saturating integrator 22 in order to prevent the performance degradation introduced by such loop control errors.

As is described below, saturating integrator 22 is operative to integrate the difference between the RSSI and AGC_REF signals when $V_{AGC}$ is between AGC_HIGH and AGC_LOW. When saturating integrator 22 is not performing an integration operation, the gain control signal $V_{AGC}$ is held constant at either AGC_HIGH or AGC_LOW, thereby improving control loop response as described above. In a preferred embodiment of the invention, decision logic within saturating integrator 22 considers the value of RSSI and AGC_REF, in conjunction with the magnitude of $V_{AGC}$ relative to AGC_HIGH and AGC_LOW.

Referring again to FIG. 1, saturating integrator 22 receives the RSSI signal from detector 25, along with the AGC_REF signal from the controller. In order to provide accurate power control, in general it is necessary for the difference between the RSSI signal and the AGC_REF signal to be minimized. Saturating integrator 22 is used to provide this function in the AGC loop by forcing the difference to zero. For example, if the gain of the signal is too high, the RSSI signal will also be high as compared to AGC_REF. Until these signals are of equivalent magnitude, the integrator output signal $V_{AGC}$ will continue to decrease the gain of amplifier 18.

It should be understood that the RSSI measurement can be made at various points in the processing of the received signal. Although FIG. 1 illustrates that the measurement is made after frequency downconversion by downconverter 20, the measurement can be made at any point in the signal processing chain following IF amplifier 18. The RSSI measurement will preferably be made subsequent to completion of signal filtering, thereby minimizing the measured spurious interference power. In using analog power control techniques for both the wideband and narrowband signals, the same power control circuitry can be used for both modes of operation.

With respect to a transmitter portion 30 of the portable telephone of FIG. 1, transmit power is also controlled. The $V_{AGC}$ signal is again used to provide instantaneous control of transmit power in CDMA mode. The $V_{AGC}$ signal is provided to the transmitter portion 30, along with various other control signals from the controller (not shown).

Figure 3:
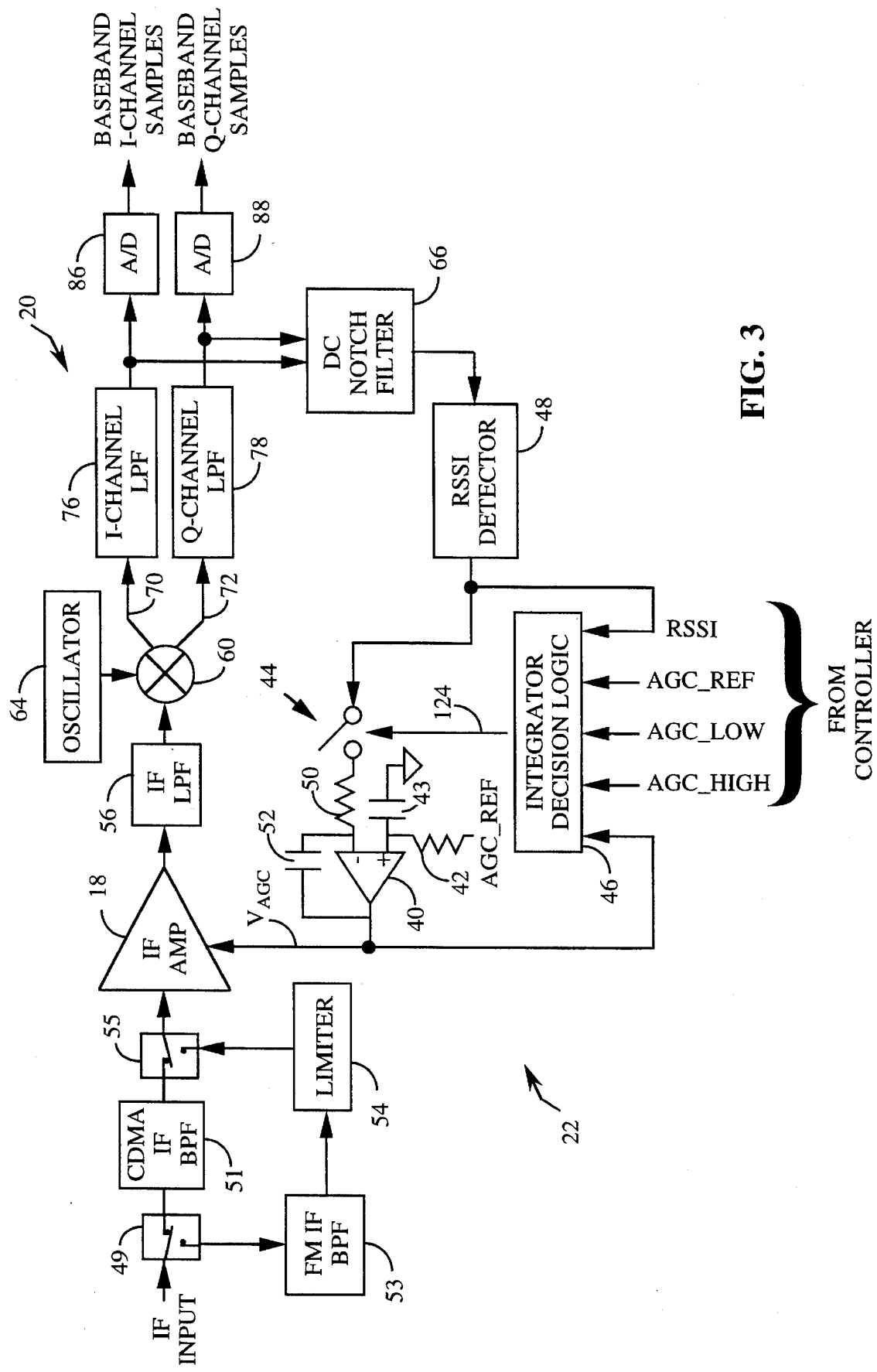
FIG. 3 shows an exemplary embodiment of the automatic gain control apparatus of the invention which includes a control loop implemented in analog form.

Referring now to FIG. 3, there is shown an exemplary embodiment of the automatic gain control apparatus of the invention which includes a partially analog implementation of saturating integrator 22. In FIG. 3, the saturating integrator includes operational amplifier (op amp) integrator 40 having a feedback network configured such that integrator 40 functions as an integrator. In particular, integrator 40 receives the AGC_REF signal through resistor 42 at its non-inverting input, to which is also connected capacitor 43. When switch 44 is closed in response to control information provided by integrator decision logic 46, an RSSI signal output by RSSI detector 48 is received by integrator 40 through resistor 50. When switch 44 is held in an open position in response to control information from integrator decision logic 46, a capacitor 52 serves to hold the output ($V_{AGC}$) of integrator 40 relatively constant at either AGC_HIGH or AGC_LOW. This prevents saturation of amplifier 18 when the magnitude of the IF input signal departs from a predefined dynamic range.

Again referring to FIG. 3, an embodiment of a switching arrangement is shown using RF switches 49 and 55. RF switches 49 and 55 couple CDMA IF bandpass filter 51 to IF amplifier 18 during CDMA mode as shown by the setting of the switches in FIG. 3. In FM mode, the position of RF switches 49 and 55 changes to couple FM IF bandpass filter 53 and limiter 54 to IF amplifier 18. FM IF bandpass filter 53 for rejecting out-of-channel interference defines the bandwidth of the FM signals provided through limiter 54 to amplifier 18. For example, in FM mode operation the FM IF filter 53 is designed to have a passband spanning approximately one cellular channel (e.g., 30 kHz), and a stopband extending significantly beyond (e.g., ±60 kHz) the IF center frequency. During CDMA mode operation the CDMA IF filter 51 is designed to reject out-of-channel interference and defines the bandwidth of the CDM A signals provided to amplifier 18. For example during CDM A mode, CDM A IF bandpass filter 151 may provide a passband commensurate with the chip rate of the baseband portion of the receiver (e.g. 1.26 MHz), and provide a predefined rejection bandwidth (e.g. 1.8 MHz). In an alternative embodiment, limiter 154 could be in the common path before IF amplifier 18.

Limiter 54 attenuates high power RF signals, which are principally received during FM mode operation. FM signals may exceed the maximum power of signals encountered during CDMA mode operation. In a preferred embodiment limiter 54 limits the input power to amplifier 18 to within the dynamic range, e.g., 80 dB, characteristic of CDMA operation. Limiter 54 allows the control range of the automatic gain control (AGC) loop of FIG. 3 to be designed on the basis of the expected CDMA dynamic range, thereby eliminating the need to provide separately calibrated AGC control loops for FM and CDMA mode operation.

Figure 4A:
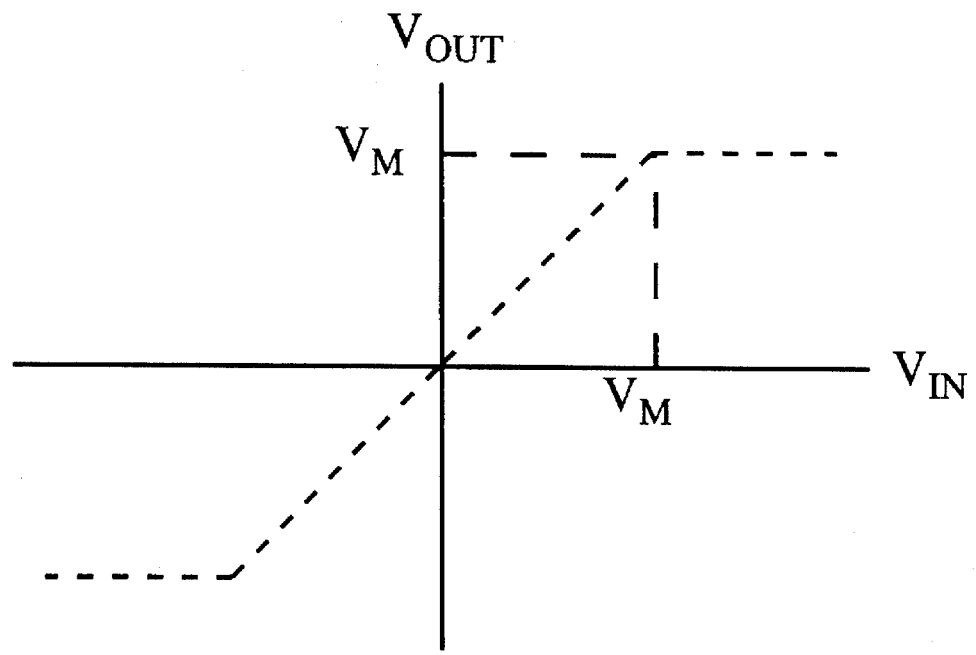
FIGS. 4A and 4B illustratively represent the voltage and power transfer characteristics, respectively, associated with an exemplary implementation of a signal limiter included within the inventive gain control apparatus.
Figure 4B:
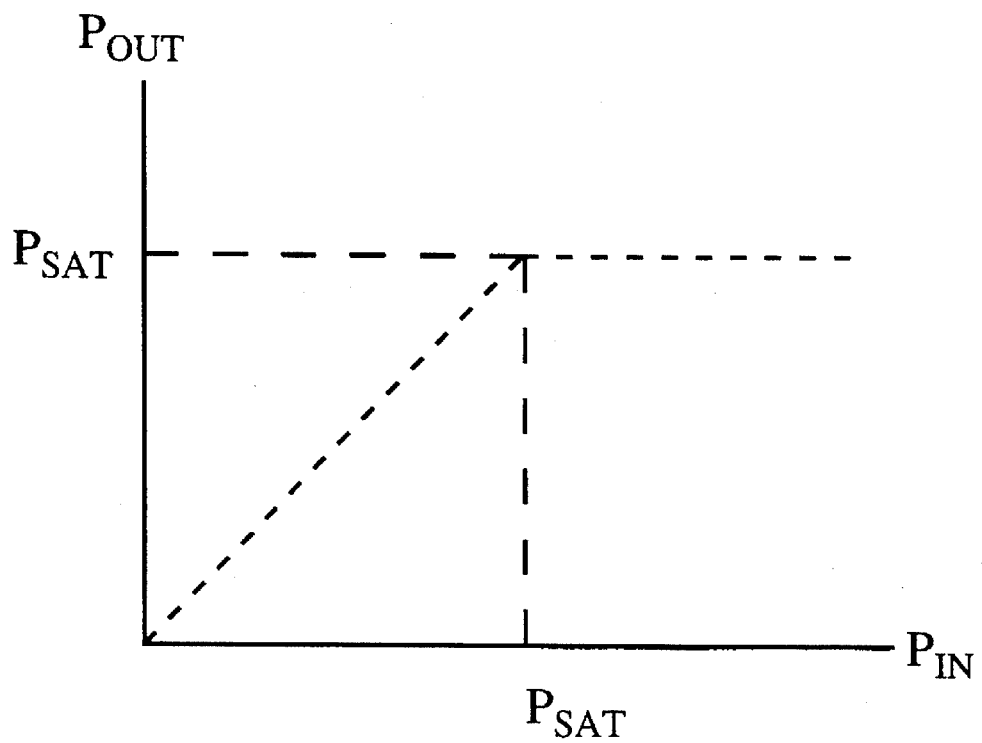

FIGS. 4A and 4B illustratively represent the voltage and power transfer characteristics, respectively, associated with an exemplary implementation of limiter 54. Referring to FIGS. 4A and 4B, limiter 54 does not attenuate signals having voltage magnitudes less than a predefined maximum voltage Vm. The saturated power may be quantified as $P_{SAT}= Vm^2/2R_L$, where $R_L$ denotes the input load impedance of amplifier 18. For input power in excess of $P_{SAT}$, the output signal power produced by limiter 54 is made to remain constant at approximately $P_{SAT}$ by clipping the peak signal voltage to the voltage Vm. The value of $P_{SAT}$ will be selected based on the maximum expected CDMA input power level. Accordingly, for high-power sinusoidal IF input signals (Pin>$P_{SAT}$), the output waveform produced by limiter 54 is truncated to a fixed amplitude but has a fundamental frequency identical to the frequency of the IF input frequency and the phase information originally inherent therein is restored by the low-pass filtering effected by lowpass filter 56.

Low-pass filter 56, included within the downconverter 20, is designed to have a cut-off frequency larger than the frequency of the IF signal output by amplifier 18 in either CDMA mode or FM mode. As noted above, low-pass filter 56 is designed to attenuate harmonics of the IF signal output by amplifier 18 prior to downconversion to baseband in-phase (I) and quadrature phase (Q) components. High-power waveforms clipped by limiter 54 create unwanted harmonics. IF lowpass filter 56 removes the unwanted harmonics so that they are not converted to baseband along with the desired IF signal information. In an exemplary embodiment the type, order, and passband edge of filter 56 are selected to attenuate the baseband distortion products arising from the IF harmonics inherent in the amplified IF signal produced by amplifier 18.

The filtered IF signal is provided to a first input of a mixer 60, while the other input of n-fixer 60 receives a locally generated reference signal from oscillator 64. Mixer 60 mixes the filtered IF signal with the reference signal to produce the I and Q baseband components on output lines 70 and 72, respectively. The mixer 60 is designed to map a frequency which is offset from the IF center frequency by a predefined margin, e.g. by from 3 to 300 Hz, to the baseband DC frequency. Such a DC offset margin allows the automatic gain control loop of FIG. 3 to distinguish between an unmodulated FM signal (i.e., a continuous wave (CW) signal) from an input DC offset error. Specifically, mixer 60 will preferably be operative to produce an output frequency of approximately 100 Hz in response to an input CW signal at the midband IF frequency. In this way input DC offset errors tending to corrupt RSSI power measurements are removed by a DC notch filter 66 without attenuating CW signal information.

Referring again to FIG. 3, output lines 70 and 72 are respectively connected to baseband I and Q lowpass filter networks 76 and 78. Filter networks 76 and 78 will preferably each be implemented so as to provide lowpass transfer functions exhibiting cutoff frequencies of 13 kHz and 630 kHz, respectively, during FM and CDMA mode operation.

In an exemplary embodiment filters 76 and 78 each include a pair of filters, one of which is employed during CDMA mode operation and the other during FM mode operation. The individual filters included within networks 76 and 78 are switched into the baseband I and Q signal paths, respectively, in accordance with the selected mode of operation. In the preferred embodiment the system controller includes means for switching the filters included within the filter networks in accordance with the operative mode selected.

After filtering by baseband filter networks 76, 78 and by DC notch filter 66, the resulting baseband I and Q signals are provided to RSSI detector 48. RSSI detector 48 provides an output RSSI signal indicative of measured signal power (in dB). The difference between the RSSI signal output by RSSI detector 48 and AGC_REF is integrated within saturating integrator 22 so as to produce the control voltage $V_{AGC}$.

Again referring to FIG. 3, the I and Q outputs of the baseband filter networks 76 and 78 are also provided to I and Q analog to digital (A/D) converters 86 and 88, respectively. A/D converters 86 and 88 operate to quantize the baseband I and Q signals for digital demodulation in the selected operative mode, i.e., either CDMA or FM. In the preferred embodiment the dynamic range of A/D converters 86 and 88 is selected to be sufficient to accommodate signals that exceed the control range of the AGC apparatus of IF amplifier 18. As was noted above with reference to FIGS. 2 and 3, decision logic 46 within saturating integrator 22 constrains the control voltage $V_{AGC}$ to within the range AGC_LOW<$V_{AGC}$<AGC_HIGH. This prevents amplifier 18 from saturating in a nonlinear operating region.

Accordingly, A/D converters 86 and 88 are designed to quantize input signals, without distortion, whether or not integrator 40 is saturated. In the preferred embodiment, each of A/D converters 86 and 88 provides 6 to 8 bits of dynamic range. This dynamic range is sufficient to provide no degradation in the signal to noise ratio of the input to converters 86 and 88 as compared to the signal to noise ratio of the quantized digital output of converters 86 and 88 for any RF input level. For example, when $V_{AGC}$ reaches AGC_LOW and the input signal continues to increase, limiter 54 constrains the amplitude of the IF signal. In this way, the signal level at the input of A/D converters 86 and 88 may exceed the level indicated by AGC_REF by only some fixed amount. Therefore, A/D converters 86 and 88 will continue to accurately quantize the baseband signals at the increased level.

Likewise the dynamic range of A/D converters 86 and 88 is sufficient to provide no degradation of the signal to noise ratio at low RF input signal levels. For example when $V_{AGC}$ reaches AGC_HIGH and switch 44 opens, if the input RF signal continues to fall, the baseband signal level at the input of A/D converters 86 and 88 falls below the level indicated by AGC_REF. The decreased level of the input to A/D converters 86 and 88 does not use the full dynamic range of the device, i.e., some of the bits of the output of the A/D converters 86 and 88 are not used. The decreased use of the full dynamic range of A/D converters 86 and 88 inherently degrades the noise figure of A/D converters 86 and 88 as compared to using the full dynamic range. However the signal to noise ratio of the input to A/D converters 86 and 88 also drops because the RF signal level approaches the thermal noise floor of the telephone. Due to the reduction of signal to noise ratio of the input to A/D converters 86 and 88, the signal to noise ratio of the output to A/D converters 86 and 88 is not effected by the degraded noise figure of A/D converters 86 and 88. Therefore the signal to noise ratio of the output of the A/D converters 86 and 88 is not significantly affected by the decreased use of the full dynamic range of A/D converters 86 and 88. In this manner, the AGC apparatus of the invention enables a limited range AGC control loop to be used in demodulating signals spanning a substantially larger dynamic range than the control range of the IF amplifier 18.

Figure 5:
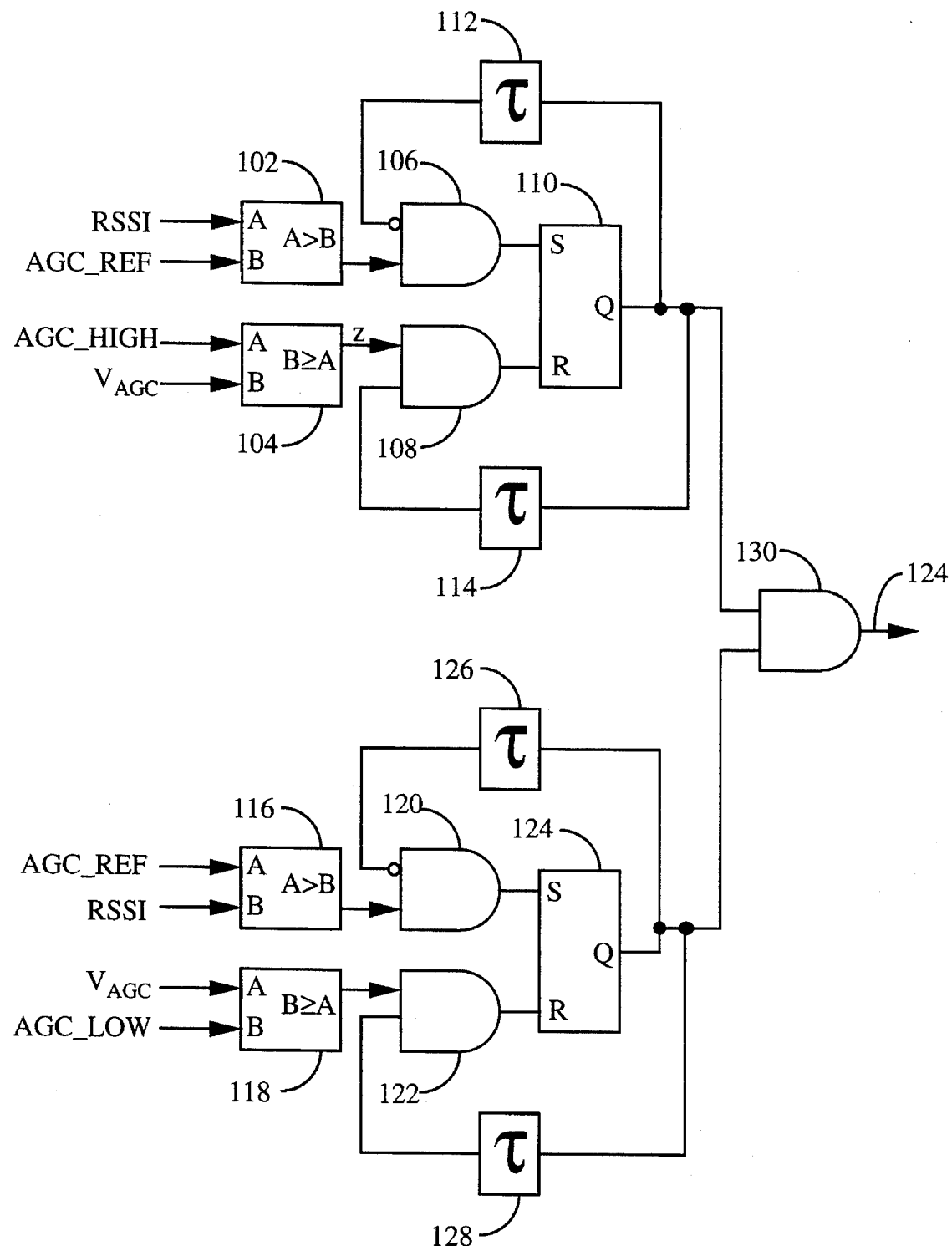
FIG. 5 depicts an exemplary implementation of decision logic used to govern operation of an integration control switch.

FIG. 5 depicts an exemplary implementation of decision logic 46 operative to control the position of switch 44. As shown in FIG. 5, the AGC_HIGH and $V_{AGC}$ signals are presented to logical comparator 104. When $V_{AGC}$ exceeds the level of AGC_HIGH, the output of comparator 104 becomes a logic level one (1). The output of comparator 104 is logically AND'ed with the output of flip-flop 110, which is at a logic level 1 due to the closed position of switch 44. The output of flip-flop 110 is delayed through delay element 114 to prevent excessive, spurious toggling of the position of switch 44. AND gate 108 and delay element 114 operate to prevent switch 44 from being opened until after a fixed period of time following its closure. The output of AND gate 108 transitions from low to high thus resetting the output of flipflop 110 to a logic level 0 and producing a logic level 0 at the output of AND gate 130 and opening switch 44. When switch 44 is opened, the RSSI signal and AGC_REF signal are no longer forced by the loop to be equivalent. In the case when AGC_HIGH has been exceeded and the loop is opened, the RSSI signal indicates a smaller signal than AGC_REF and the output of logical comparator 102 becomes a logic level 0. When the RSSI signal exceeds the level of AGC_REF, the output of comparator 102 transitions high and the output of AND gate 106 also transitions high, thus setting the output of flip-flop 110 to logic level 1 and closing switch 44. Delay element 112 and AND gate 106 function similarly to delay 114 and AND gate 108, and prevent closure of switch 44 until it has been open for a predefined time period.

An analogous sequence of logical operations is executed when the level of the RF input signal exceeds the AGC range. When $V_{AGC}$ falls below the level of AGC_LOW, the output of comparator 118 becomes a logic level 1. The output of comparator 118 is logically AND'ed with the output of flip-flop 124, which is at a logic level 1 when switch 44 is closed. The output of AND gate 122 then transitions from low to high, thus resetting the output of flip-flop 124 to a logic level 0. This causes a logic level 0 to appear at the output of AND gate 130, which results in the opening of switch 44. When switch 44 is opened, the RSSI signal is no longer forced by the loop to be equal to AGC_REF. Upon the loop being opened in this manner the RSSI signal will be larger than AGC_REF and the output of logical comparator 116 will be at logical level 0. When the RSSI signal becomes smaller than AGC_REF, the outputs of comparator 116 and AND gate 120 transition high. The transition sets the output of flip-flop 124 to logic level I and closes switch 44. Delay elements 126 and 128 and AND gates 120 and 122 function similarly to delay 114 and AND gate 108, and serve to prevent rapid toggling of switch 44 between open and closed positions.

The logical output of AND gate 130 can be considered an integration enable signal and is impressed upon a switch control line 124 connected to switch 44. In the preferred embodiment switch 44 is closed in response to the impression of a logical 1 upon control line 124, and is opened when a logical 0 is impressed thereupon. Integrator decision logic 46 thus controls when the difference between the RSSI and AGC_REF signals is integrated by op amp integrator 40. In this way integrator decision logic 46 and integrator 40 cooperate to provide the $V_{AGC}$.

The operation of the AGC apparatus of FIG. 3 may be described in greater detail with reference to the timing diagrams of FIGS. 6A–6C. In particular, FIGS. 6A and 6B respectively depict the time variation in the power of an exemplary RF signal and the corresponding state (open or closed) of switch 44 within saturating integrator 22. FIG. 6C shows the corresponding value of the gain control voltage ($V_{AGC}$) generated by op amp integrator 40 in response to the RF input signal of FIG. 6A.

Figure 6A:
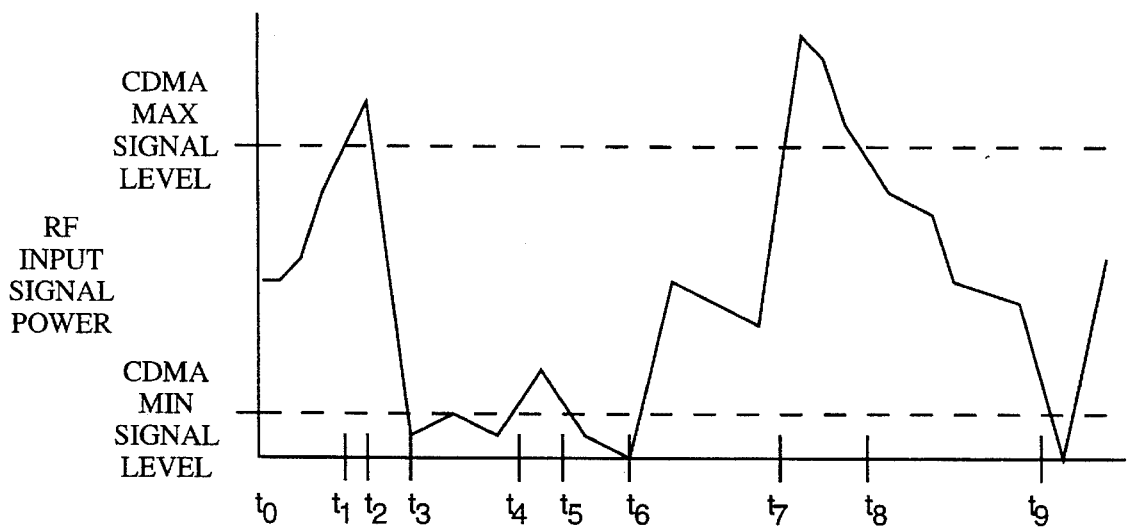
FIGS. 6A–6C are timing diagrams illustrative of the operation of the AGC apparatus of the invention.
Figure 6B:
Figure 6C:

As is indicated by FIGS. 6A and 6C, over a first integration interval ($T_0 < t < t_1$) the power of the RF input signal is confined to the AGC control range of the AGC loop, and accordingly AGC_LOW < $V_{AGC}$ < AGC_HIGH (FIG. 6C). At time $t=t_1$, integrator decision logic 46 determines that $V_{AGC}$ has reached AGC_LOW, and consequently opens switch 44. Switch 44 remains open over the time interval $t_1 < t < t_2$, during which time integrator 40 is prevented from integrating the difference between RSSI and AGC_REF. During this time the input of A/D converters 86 and 88 is constrained by limiter 54. At time $t=t_2$ the RF input signal power has again become less than the upper bound of the loop control range, which results in switch 44 being closed by integrator decision logic 46 and $V_{AGC}$ exceeding AGC_LOW. Switch 44 then remains closed over a second integration interval ($t_2 < t < t_3$) until the control voltage $V_{AGC}$ reaches AGC_HIGH, at which time switch 44 is again opened by integrator decision logic 46. During this time the input of A/D converters 86 and 88 varies in response to changes in RF input signal level. In a similar manner switch 44 is closed by integrator decision logic 46 at times $t_4$, $t_6$ and $t_8$ in order to initiate third, fourth and fifth integration intervals.

Figure 7:
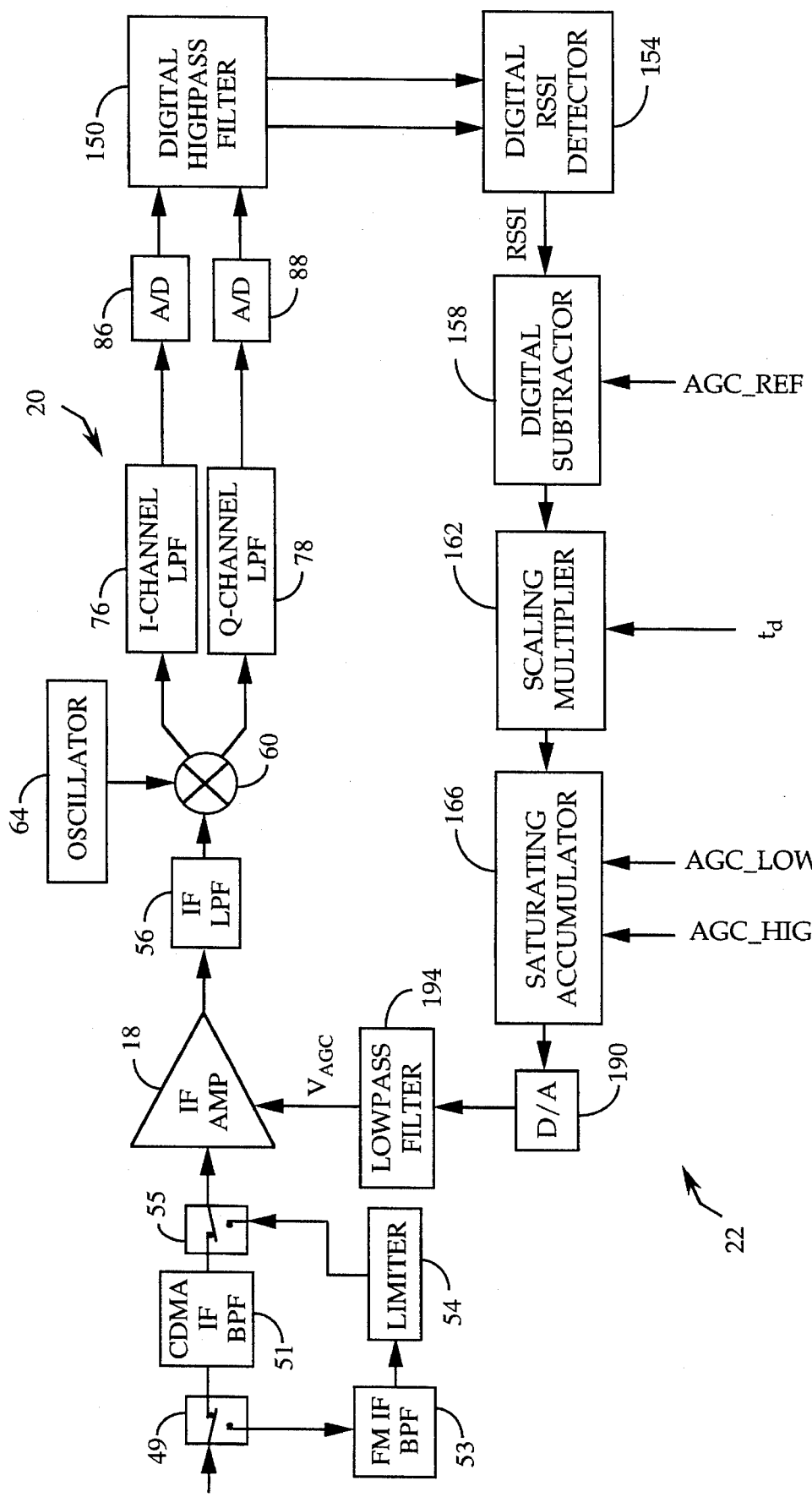
FIG. 7 shows a preferred embodiment of the AGC apparatus of the invention including a digital realization of the control loop.

Referring now to FIG. 7, there is shown a preferred embodiment of the AGC loop of the invention in which is included a digital realization of saturating integrator 22. In the embodiment of FIG. 7 digital highpass filter 150, rather than analog DC notch filter 66, is employed to remove the DC offset inherent in the baseband I and Q samples produced by A/D converters 86 and 88. The cutoff frequency of filter 150 is selected to be substantially less than the frequency offset introduced within mixer 60. In an alternate implementation of removal of the DC offset may be achieved by:

(i) separately determining averages of the baseband I and Q signal samples, and (ii) subtracting the resultant DC component from each I and Q component prior to further processing.

Digital RSSI detector 154 will typically include a look-up table containing values of log power indexed as a function of the magnitudes of the baseband I and Q samples. Digital RSSI detector 154 approximates log power, i.e., 10 LOG ($I^2+Q^2$), by determining the value of LOG(MAX{ABS(I), ABS(Q)}) and the value of a correction term. The operation MAX{ABS(I),ABS(Q)} produces an output value equivalent to the magnitude of the largest component of a given I/Q sample pair. In a particular implementation this output value serves as an index into a look-up table of log power. The output derived from the look-up table is then added to a correction term approximately equivalent to the difference between LOG ($I^2+Q^2$) and LOG(MAX{ABS(I),ABS(Q)}).

The received power estimate, i.e., the RSSI signal, produced by RSSI detector 154 is supplied to digital subtractor 158 along with the AGC_REF signal. The resulting error signal is then scaled in accordance with a desired loop time constant $t_d$ by digital scaling multiplier 162. The loop time constant $t_d$ is chosen in accordance with the expected fading characteristics of the RF input signal. Relatively short loop time constants (faster loop response) will generally be selected to enable tracking of signals exhibiting abrupt fading characteristics.

In a preferred embodiment scaling multiplier 162 may be programmed to multiply the error signal from subtractor 158 by a first loop time constant in response to decaying RSSI signals, and to multiply by a second loop time constant when the value of the RSSI signal is increasing. This allows for further flexibility in tailoring the AGC loop response on the basis of the fading characteristics of the operational environment and minimizes loop overshoot.

Referring again to FIG. 7, scaled error signal generated by scaling multiplier 162 is provided to saturating accumulator 166. Saturating accumulator 166 operates to accumulate values of the scaled error signal into an aggregate error signal until the aggregate error signal reaches either AGC_HIGH or AGC_LOW. The value of the aggregate error signal is then held at either AGC_HIGH or AGC_LOW until a scaled error signal is received which, after combination with the existing aggregate error signal, results in an aggregate error signal within the range defined by AGC_HIGH and AGC_LOW.

Figure 8:
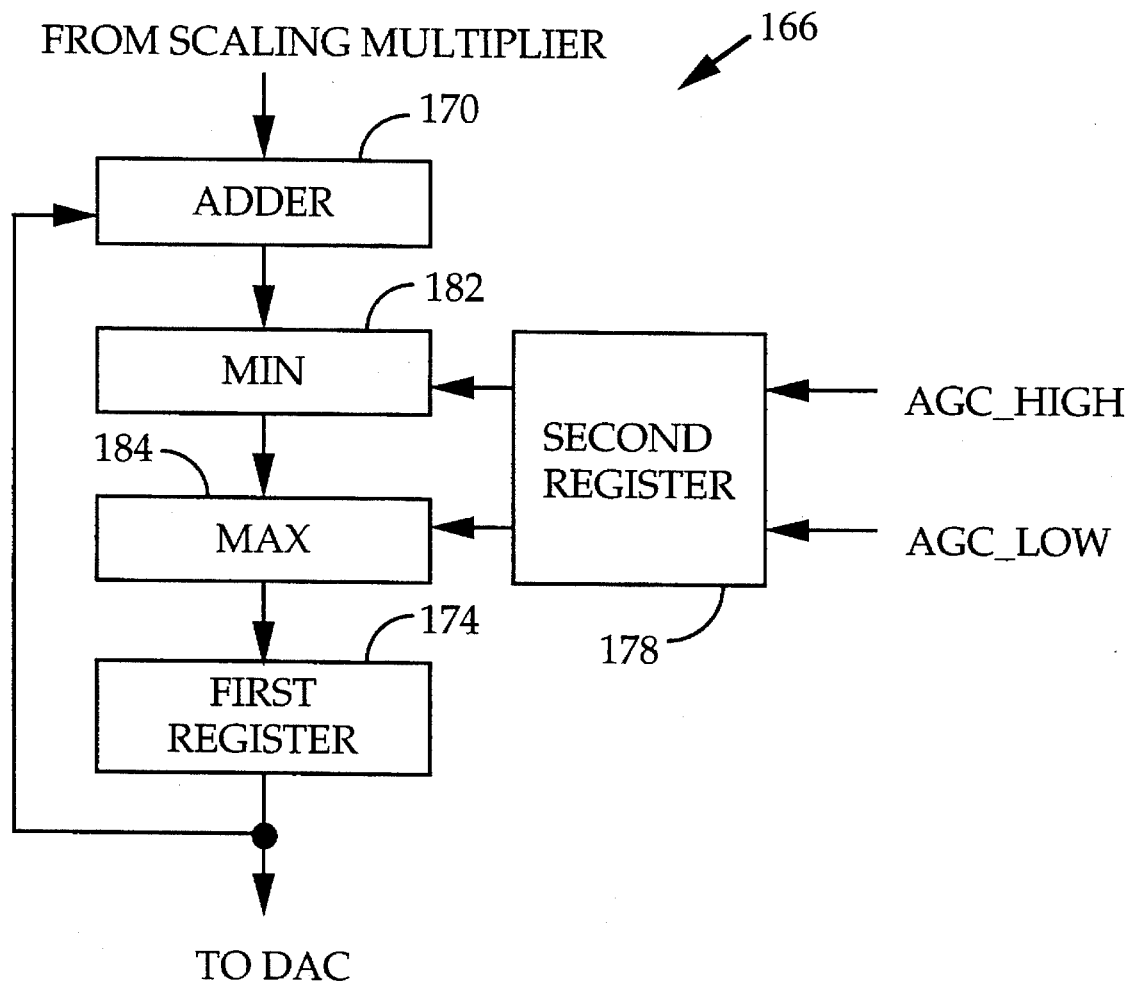
FIG. 8 depicts an exemplary implementation of a digital saturating accumulator included within the integrator of FIG. 7.

FIG. 8 depicts an exemplary implementation of saturating accumulator 166. As is indicated by FIG. 8, the scaled error signal is provided to a first input of a digital adder 170. The scaled error signal is added within digital adder 170 to the aggregate error signal produced by saturating accumulator 166, where the aggregate error signal is stored in first register 174. The values of AGC_HIGH and AGC_LOW provided by a system controller (not shown) are stored within second register 178. Minimum and maximum signal clippers 182 and 184, coupled to second register 178, constrain the value of the digital signal provided to first register 174 to within the range defined by AGC_HIGH and AGC_LOW.

The digital implementation of highpass filter 150, RSSI detector 154 and saturating integrator 22 depicted in FIGS. 7 and 8 offers several advantages relative to corresponding analog realizations. For example, the digital components utilized therein are not susceptible to temperature drift, and allow the integration time constant to be adjusted in accordance with expected signal fading conditions so as to expedite loop signal acquisition. In addition, a filter and integrator implemented in digital form occupy significantly less volume than a corresponding arrangement of discrete resistive and capacitive components.

It is also anticipated that the utilization of a digital RSSI detector and a digital saturating integrator will result in improved accuracy. In particular, during the period when the value of $V_{AGC}$ is required to be maintained at either AGC_HIGH or AGC_LOW, capacitive discharge and the like associated with analog components will generally result in the value of $V_{AGC}$ "drooping" from the desired level over a period of time. The digital implementation of the saturating integrator shown in FIGS. 7 and 8 does not exhibit the signal "droop" characteristic of analog integrators.

Referring again to FIG. 7, the aggregate error signal stored within register 174 of saturating accumulator 166 is provided to digital to analog converter (DAC) 190. In a preferred embodiment the resolution of DAC 190 will be sufficient to provide an output analog AGC step size of less than 1 dB. Alternatively, a pulse width modulated (PWM) or pulse density modulated (PDM) output pulse sequence of 0,1 logic levels is produced in response to the aggregate error signal. PDM signaling is explained in U.S. patent application Ser. No. 08/011,618, entitled "Multibit To Single Bit Digital Signal Converter", and assigned to the Assignee of the present invention. The average value of the output pulse sequence corresponds to the desired analog output voltage.

The analog output provided by DAC 190 is passed through lowpass filter 194 prior to being applied to the gain control port of IF amplifier 18. Lowpass filter 194 is designed to attenuate any spurious output produced by DAC 190.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. An automatic gain control apparatus comprising an adjustable gain amplifier, said adjustable gain amplifier having an input port for receiving an input signal, a control port for receiving a gain control signal, and an output port for providing an output signal, said automatic gain control apparatus comprising:

means for generating a received power signal based on the power of said output signal;

saturating integrator means for comparing, in response to an integration enable signal, said received power signal to a reference signal and for generating said gain control signal; and decision means for creating said integration enable signal in response to the value of said gain control signal, the value of said received power signal, and the value of said reference signal.

2. The automatic gain control apparatus of claim 1 wherein said integration enable signal disables said saturating integrator means when the value of said gain control signal follows below a first predefined threshold and when said gain control signal exceeds a second predefined threshold.

3. The automatic gain control circuit of claim 2 wherein when said gain control signal follows below said first predefined threshold, said integration enable signal disables said saturating integrator means until the value of said received power signal is less than said reference signal.

4. The automatic gain control circuit of claim 2 wherein when said gain control signal exceeds said second predefined threshold, said integration enable signal disables said saturating integrator means until the value of said received power signal is greater than said reference signal.

5. The automatic gain control circuit of claim 1 further comprising an analog to digital converter operatively coupled to said output port of said adjustable gain amplifier, said analog to digital converter being operative, over a predefined dynamic range, to generate digital samples of said output signal.

6. The automatic gain control circuit of claim 1 further comprising:

a downconverter having an input port connected to said output port of said adjustable gain amplifier for frequency downconverting said output signal;

limiter means for constraining power variation in said input signal to an input dynamic range; and an analog to digital converter operatively coupled to an output of said downconverter, said analog to digital converter being operative, over a predefined dynamic range, to generate digital samples of said downconverted output signal;

wherein when the magnitude of said input signal is within said input dynamic range the corresponding magnitude of said output signal is within said predefined dynamic range.

7. The automatic gain control apparatus of claim 1 further comprising means for frequency downconverting said output signal to a baseband frequency so as to produce a baseband signal, said means for downconverting comprising means for downconverting a predefined center frequency of said output signal to a baseband frequency offset by a predetermined margin from DC, thereby enabling DC offset errors within said output signal to be distinguished from continuous wave signals within said output signal.

8. The automatic gain control apparatus of claim 7 wherein said means for downconverting comprises a DC notch filter for attenuating signals having a frequency below a baseband frequency from said baseband signal.

9. A method for automatic gain control using an adjustable gain amplifier, the adjustable gain amplifier having an input port for receiving an input signal, a control port for receiving a gain control signal, and an output port for providing an output signal, the automatic gain control method comprising the steps of:

generating a received power signal based on the power of said output signal;

integrating in response to an integration enable signal the difference between said received power signal and a reference signal and generating said gain control signal; and providing said integration enable signal based on values of said received power, said reference signal, and said gain control signal.

10. The method of automatic gain control of claim 9, wherein said step of providing said integration enable signal comprises the steps of:

disabling said integration enable signal while the value of said gain control signal is less than a first predefined threshold, and enabling said integration enable signal if the value of said received power signal is less than said reference signal.

11. The method of automatic gain control of claim 9, wherein said step of providing said integration enable signal comprises the steps of:

disabling said integration enable signal while the value of said gain control signal exceeds a second predefined threshold, and enabling said integration enable signal if the value of said received power signal is greater than said reference signal.

12. The method of automatic gain control of claim 9 further comprising the step of generating digital samples of said output signal such that when magnitude of said output signal is within a predefined dynamic range said digital samples are of magnitudes proportional to said magnitude of said output signal.

13. The method of automatic gain control of claim 12 further comprising the step of constraining power variation in said input signal to an input dynamic range, thereby resulting in power variation in said output signal being constrained to within said predefined dynamic range.

14. The method of automatic gain control of claim 12 wherein said step of generating said received power signal comprises the steps of accumulating said digital samples to produces said received power signal.

15. The method of automatic gain control of claim 14 wherein said step of integrating comprises the steps of:

subtracting said received power signal from said reference signal to provide an error signal;

scaling said error signal in accordance with a lap time constant; and accumulating said scaled error signal in response to said integration enable signal.

16. A dual-mode digital receiver for processing signals from CDMA and FM cellular communication systems, the digital receiver having an automatic gain control apparatus comprising an adjustable gain amplifier wherein the adjustable gain amplifier comprises an input port for receiving an input signal, a control port for receiving a gain control signal, and an output port for providing an output signal, the automatic gain control apparatus comprising:

select means for selecting a CDMA gain control mode and for selecting an FM gain control mode;

first means for filtering the output signal upon selection of the CDMA gain control mode, and second means for filtering the output signal upon selection of the FM gain control mode;

means for generating a received power signal based on power of the output signal;

means for integrating the received power signal as compared to a reference signal and producing the gain control signal; and means for enabling the means for integrating based on values of the reference signal, the received power signal and the gain control signal.

17. An automatic gain control apparatus including an adjustable gain amplifier, the adjustable gain amplifier having an input port for receiving an input signal, a control port for receiving a gain control signal, and an output port for providing an output signal, the automatic gain control apparatus comprising:

means for generating a received power signal based on power of said output signal;

saturating integrator means for comparing said received power signal to a reference signal and for generating an error signal in response to a result of the comparison, said saturating integrator means including means for providing said gain control signal by accumulating said error signal exclusively over one or more integration intervals and decision means for defining said one or more integration intervals based on values of said error and gain control signals.

18. The automatic gain control circuit of claim 17 wherein said means for generating said received power signal comprises means for accumulating said digital samples to produce said received power signal.

19. The automatic gain control apparatus of claim 18 wherein said saturating integrator means further comprises:

means for subtracting said received power signal from said reference signal to provide an error signal;

means for scaling said error signal in accordance with a loop time constant; and means for accumulating said scaled error signal in response to said integration enable signal.

20. An automatic gain control apparatus including an adjustable gain amplifier, the adjustable gain amplifier having an input port for receiving an input signal, a control port for receiving a gain control signal, and an output port for providing an output signal, the automatic gain control apparatus comprising:

means for generating a received power signal based on power of said output signal; and saturating integrator means for comparing said received power signal to a reference signal and for generating an error signal in response to a result of the comparison, said saturating integrator means including means for providing said gain control signal by selectively integrating said error signal based on values of said error and gain control signals.

21. The automatic gain control apparatus of claim 20 wherein said saturating integrator means includes first means for selectively enabling said error signal to be integrated only while magnitude of said gain control signal is less than a first predefined threshold, and second means for selectively enabling said error signal to be integrated only while magnitude of said gain control signal exceeds a second predefined threshold.

22. The automatic gain control circuit of claim 20 further including an analog to digital converter operatively coupled to said output port of the adjustable gain amplifier, said analog to digital converter being operative, over a predefined dynamic range, to generate digital samples of said output signal.

23. The automatic gain control circuit of claim 20 further including:

a downconverter having an input port connected to said output port of said adjustable gain amplifier for downconverting frequency of said output signal;

limiter means for constraining power variation in said input signal to an input dynamic range; and an analog to digital converter operatively coupled to an output of said downconverter, said analog to digital converter being operative, over a predefined dynamic range, to generate digital samples of said downconverted output signal;

wherein when the magnitude of said input signal is within said input dynamic range the corresponding magnitude of said output signal is within said predefined dynamic range.

24. The automatic gain control circuit of claim 22 wherein said saturating integrator means includes:

means for accumulating said digital samples into a digital control signal, and digital to analog converter means for converting said digital control signal into said gain control signal.

25. A method for automatic gain control using an adjustable gain amplifier, the adjustable gain amplifier having an input port for receiving an input signal, a control port for receiving a gain control signal, and an output port for providing an output signal, the automatic gain control method comprising the steps of:

generating a received power signal based on power of said output signal;

comparing said received power signal to a reference signal and generating an error signal in response to a result of the comparison; and providing said gain control signal by selectively integrating said error signal in accordance with values of said error and gain control signals.

26. The method of automatic gain control of claim 25 wherein said step of providing said gain control signal includes the steps of:

integrating said error signal over a first interval only while magnitude of said gain control signal is less than a first predefined threshold, and integrating said error signal over a second interval only while magnitude of said gain control signal exceeds a second predefined threshold.

27. The method of automatic gain control of claim 25 further including the step of generating digital samples of said output signal such that when magnitude of said output signal is within a predefined range said digital samples are of magnitudes proportional to said magnitude of said output signal.

28. The method of automatic gain control of claim 27 further including the step of constraining power variation in said input signal to an input dynamic range, thereby resulting in power variation in said output signal being constrained to within said predefined dynamic range.

29. The method of automatic gain control of claim 27 further including the steps of:

accumulating said digital samples into a digital control signal, and converting said digital control signal into said gain control signal.

30. The method of automatic gain control of claim 29 further including the step of scaling said digital samples in accordance with a loop time constant, said loop time constant being related to response of said automatic gain control apparatus to variation in magnitude of said input signal.

31. The automatic gain control apparatus of claim 24 wherein said saturating integrator means further includes means for scaling said digital samples in accordance with a loop time constant, said loop time constant being related to response of said automatic gain control apparatus to variation in magnitude of said input signal.

32. The automatic gain control apparatus of claim 20 wherein said saturating integrator means includes decision means for selectively integrating said error signal when the magnitude of said gain control signal is between upper and lower thresholds, said decision means including means for preventing integration of said error signal otherwise;

wherein said adjustable gain amplifier is operative to provide a predetermined range of gain in response to gain control signals having magnitudes between said upper and lower thresholds.

33. The automatic gain control apparatus of claim 20 further including means for downconverting frequency of said output signal to a baseband frequency so as to produce a baseband signal, said means for downconverting including means for downconverting a predefined center frequency of said output signal to a baseband frequency offset by a predetermined margin from a baseband DC frequency, thereby enabling DC offset errors within said output signal to be distinguished from continuous wave signals within said output signal.

34. The automatic gain control apparatus of claim 33 wherein said means for downconverting includes a DC notch filter for removing signals at said baseband DC frequency from said baseband signal.

35. A dual-mode digital receiver for processing signals from CDMA and FM cellular communication systems, the digital receiver having an automatic gain control apparatus including an adjustable gain amplifier wherein the adjustable gain amplifier includes an input port for receiving an input signal, a control port for receiving a gain control signal, and an output port for providing an output signal, the automatic gain control apparatus comprising:

select means for selecting a CDMA gain control mode and for selecting an FM gain control mode;

first means for filtering said output signal upon selection of said CDMA gain control mode, and second means for filtering said output signal upon selection of said FM gain control mode;

means for generating a received power signal based on power of said output signal; and means for comparing said received power signal to a reference signal and for generating an error signal in response to a result of the comparison;

saturating integrator means for providing said gain control signal by selectively integrating said error signal based on values of said error and gain control signals.

36. An automatic gain control apparatus including an adjustable gain amplifier, the adjustable gain amplifier having an input port for receiving an input signal, a control port for receiving a gain control signal, and an output port for providing an output signal, the automatic gain control apparatus comprising:

means for generating a received power signal based on power of said output signal; and a saturating integrator having a first input for receiving a reference signal and a second input to which is switchably connected said received power signal, said saturating integrator being disposed to selectively integrate said received power signal so as to generate a gain control signal within a predefined control range.

37. The automatic gain control circuit of claim 36 further including an analog to digital converter operatively coupled to said output port of the adjustable gain amplifier, said analog to digital converter being operative, over a predefined dynamic range, to generate digital samples of said output signal.

38. The automatic gain control circuit of claim 37 further including limiter means for constraining power variation in said input signal to an input dynamic range;

wherein when the magnitude of said input signal is within said input dynamic range the corresponding magnitude of said output signal is within said predefined dynamic range.

39. A method for automatic gain control using an adjustable gain amplifier, the adjustable gain amplifier having an input port for receiving an input signal, a control port for receiving a gain control signal, and an output port for providing an output signal, the automatic gain control method comprising the steps of:

generating a received power signal based on power of said output signal;

selectively integrating said received power signal so as to provide a gain control signal within a predefined control range wherein said selective integration of said received power signal is performed on the basis of magnitude of said gain control signal and on magnitude of said received power signal.

* * * * *